United States Patent [19]

Clark et al.

[11] 4,231,796

[45] Nov. 4, 1980

[54] INTERNAL ZONE GROWTH METHOD FOR PRODUCING METAL OXIDE METAL EUTECTIC COMPOSITES

[75] Inventors: Grady W. Clark, Oak Ridge; John D. Holder, Knoxville; Arvid E. Pasto, Oak Ridge, all of Tenn.

[73] Assignee: The United States of America as represented by the United States Department of Energy, Washington, D.C.

[21] Appl. No.: 964,406

[22] Filed: Nov. 28, 1978

[51] Int. Cl.$^3$ .............................................. B22F 3/00
[52] U.S. Cl. ...................................... 75/206; 75/200; 75/208 R
[58] Field of Search ...................... 75/200, 208 R, 206

[56] References Cited

U.S. PATENT DOCUMENTS

| 2,743,199 | 4/1956 | Hull et al. | 75/200 |
| 3,796,673 | 3/1974 | Clark et al. | 252/515 |

OTHER PUBLICATIONS

Holder et al., "Directional Solidification by Internal Zone Melting of $Cr_2O_3$ Composites,"Conference on In Situ Composites 1976, Jackson et al., Editors, pp. 107-113.
Chapman et al., "$UO_2$-W Cermets Produced by Unidirectional Solidification,"Journal of Amer. Ceramic Soc., 53 #1, Jan. 1970.
Hartzell et al., Generalization of Internal Centrifugal Zone Growth of Metal-Ceramic Composites, USERD C00-2407-4, Aug. 1976.
Michel et al., Journal of Crystal Growth, 43 (1978), "Growth from Skull-Melting of Zirconia-Rare Earth Oxide Crystals,"pp. 546-548.
Scott et al., "Skull Melting of Synthetic Minerals,"DOE Rept. #La-7080-MS, Los Alamos Scientific Laboratory.

*Primary Examiner*—Brooks H. Hunt
*Attorney, Agent, or Firm*—James E. Denny; Stephen D. Hamel; Allen H. Uzzell

[57] ABSTRACT

An improved method for preparing a cermet comprises preparing a compact having about 85 to 95 percent theoretical density from a mixture of metal and metal oxide powders from a system containing a eutectic composition, and inductively heating the compact in a radiofrequency field to cause the formation of an internal molten zone. The metal oxide particles in the powder mixture are effectively sized relative to the metal particles to permit direct inductive heating of the compact by radiofrequency from room temperature. Surface melting is prevented by external cooling or by effectively sizing the particles in the powder mixture.

8 Claims, No Drawings

INTERNAL ZONE GROWTH METHOD FOR PRODUCING METAL OXIDE METAL EUTECTIC COMPOSITES

This invention was made in the course of, or under, a contract with the United States Department of Energy.

BACKGROUND OF THE INVENTION

The invention relates to the art of cermet preparation and especially to the preparation of unidirectionally solidified metal-metal oxide composites by internal zone growth.

Directionally solidified metal-metal oxide composites have been prepared in the prior art by inductive heating of pressed metal-metal oxide powder compacts by internal zone melting such as is described in commonly assigned U.S. Pat. No. 3,796,673 issued to G. W. Clark et al. Mar. 12, 1974, for "Method of Producing Multicomponent Metal-Metal Oxide Single Crystals," which is incorporated herein by reference. According to the internal zone growth technique, a compact, typically cylindrical, is prepared by pressing a mixture of metal and metal oxide powders in a conventional manner. The compact is sintered in some cases to increase the density. The compact is placed in an induction furnace within a radiofrequency induction coil oriented with the cylindrical compact coaxial with the coil. The compact typically had to be heated to above about 1500° C. to increase the electrical conductivity sufficiently to permit coupling of the magnetic and electric fields to the compact, thereby providing RF induction heating. Normally, the induction heating is performed in an induction furnace containing susceptors which radiantly preheat the compact to the required temperatures. After the compact has been preheated sufficiently, the susceptors are withdrawn and the sample is heated directly by the RF induction coil. The induction heating process is capable of melting a zone within the compact while maintaining a solid "skin" of the compact to contain the melt. The induction coil current is normally increased until a molten zone forms within the compact. The formation of the molten zone can be detected by monitoring the surface temperature of the compact and the RF generator grid and plate currents.

The cylindrical sample is normally oriented vertically and, after the molten zone is established, the sample is raised or lowered relative to the localized radiofrequency field. As the sample is moved, solid changes into liquid ahead of the molten zone and liquid solidifies behind the molten zone. The solidified zone is typically single crystals of oxide containing discrete metal rods. The amount of metal relative to the oxide in the solidified composite is a function of the metal and oxide compositions of the compact and the temperature of the molten zone. If the molten zone is heated no higher than the eutectic temperature, the metal and oxide in the composite will be in the eutectic proportions. After the compact has been passed through the induction heating coils, it is cooled and sectioned to provide single oxide crystals having extended metal rods. Such directionally solidified cermet composites may be useful as MHD electrode materials, gas turbine components, electron emitters, high temperature valve seats, and hard tool and grinding materials.

During the formation of the molten zone within the compact, the power level of the induction coil must be controlled to prevent catastrophic melting of the external solid surface. The thickness of the skin is also a function of the frequency and the thermal conductivity, melting temperature, magnetic permeability, size and electrical conductivity of the compact. If the frequency is too high, melting occurs on the surface rather than in the interior. If the frequency is too low, a heating instability can result in melting of the surface and escape of the melt. Control of the molten zone is further complicated in metal-metal oxide mixtures by the fact that the composition (and hence the thermal and electrical conductivity) of the molten zone varies due to unavoidable heating fluctuations. Some cermet composites, for example those employing $Cr_2O_3$ or $(Cr,Al)_2O_3$, have proven to be practically impossible to prepare by conventional internal zone growth directional solidification techniques because of the extreme dependence of electrical conductivity on the temperature of the oxide.

SUMMARY OF THE INVENTION

It is an object of this invention to provide a method for producing directionally solidified cermet composites by internal zone growth which significantly improves control of the molten zone by tailoring the electrical conductivity of the compact.

It is a further object to eliminate the need for a preheating step prior to induction heating of the metal-metal oxide compact.

It is a further object to provide a method for preparing directionally solidified $Cr_2O_3$—Mo composites by internal zone growth.

These and other objects are produced according to this invention in an improved method for preparing a cermet composite comprising the steps of preparing a compact having about 85 to 95 percent theoretical density from a mixture of metal and metal oxide powders, said metal and metal oxide comprising a system containing a eutectic composition; inductively heating said compact in a radiofrequency field to cause the formation of an internal molten zone contained within a solid skin of compact material, said metal oxide particles in said powder mixture being effectively sized relative to said metal particles to permit direct inductive heating of said compact by radiofrequency from room temperature to form said internal molten zone. In one embodiment the external surface of the compact is cooled (i.e., by other than natural radiation and convection) to prevent the surface from melting. In another embodiment the metal oxide particles in the powder mixture are effectively sized relative to the metal particles to permit inductive heating of the compact to form the molten zone without melting the external skin. No surface heat removal (other than natural convection and radiation) need be provided for this embodiment. Directionally solidified cermet composites are prepared when the compact is translated relative to the radiofrequency field causing the molten zone to move through the compact leaving a directionally solidified zone in the previously molten zones. When no translation is performed, the solidified zone contains randomly oriented short metal rods and the resulting composites are useful as an insulation having controlled electrical or thermal conductivity.

DETAILED DESCRIPTION

An aspect of this invention is the discovery that the internal zone growth method of preparing cermet composites can be significantly tailored by control of the relative particle size of the metal and metal oxide particles. If the oxide particles are sufficiently large relative to the metal particles, the metal particles move into interparticle spaces during mixing and upon pressing and/or heating to form a compact, and form a continuous or nearly continuous metal phase within the compact. The presence of the continuous or nearly continuous metal phase enhances the electrical conductivity of the compact sufficiently to enable the compact to be inductively heated directly by a radiofrequency field. In this manner, the process avoids the use of susceptors for radiant preheating.

Unless the compact is externally cooled care must be taken that the oxide particles are not too large relative to the metal particles. If the oxide particles are too large, their surface area is too small and the metal phase will have sufficient thermal conductivity to cause heat from the internal zone to melt the skin of the compact, resulting in loss of the internal molten zone. The relative sizes of the oxide particles needed to achieve the desired combination of electrical and thermal conductivity are a function of the volume percent metal within the compact. Generally, for an 8-15 volume percent metal compact, and a metal powder smaller than 100 mesh (U.S. Standard Sieve size), oxide powders of $-50$ to $+80$ mesh are suitable. For a metal volume greater than 15 percent, smaller oxide particles are required to maintain the thermal conductivity at acceptable levels. For a metal volume smaller than 8 percent, larger oxide particles are needed to result in an electrical conductivity sufficient to permit RF coupling at room temperature. For metal powders smaller than $-100$ mesh, a slightly smaller oxide particle size could be tolerated, however $-50 +80$ mesh have resulted in good finished articles with metal particles as small as $-325$ mesh and 15 volume percent metal.

It is well within the skill of the art to determine the proper particle size for oxide and metal particles herein by routine iterative runs. All that is required for this determination is that a compact be prepared having about 85 to 95 percent theoretical density, which can be obtained by conventional techniques such as hot pressing or sintering. The compact, normally having a cylindrical shape, is then placed in a radiofrequency induction furnace. The radiofrequency coil is activated and the power increased to determine whether the compact can be inductively heated from room temperature by the radiofrequency field without supplemental heating, i.e., susceptors. If the compact cannot be heated by the induction coil, the size of the oxide particles in the powder mixture must be increased or the size of the metal decreased. If the compact can be heated by the induction coil to form a molten zone but the molten zone cannot be contained within the compact due to surface melting, surface cooling must be provided or the particle size of the oxide in the powder mixture must be decreased or the metal particle size increased. Experience has shown that when metal particles of $-100$ mesh or smaller are used, little variation in electrical or thermal conductivity of the compact results from variation in metal particle size. Consequently, when such fine metal particles are used, the oxide particle size should be varied to provide the appropriate balance between electrical and thermal conductivities.

It has been found as a general rule that the electrical conductivity of the compact at the surface temperature should be about the same or slightly lower than the electrical conductivity of the molten zone within the article. While some minor variation is expected, depending upon the components of the mixture, the operating (skin) temperature electrical conductivity of the compact should be about 0-100 ohm-cm$^{-1}$ below the electrical conductivity of the eutectic at its melting point.

The frequency (f) of the current through the induction coil can be easily calculated. The frequency is related to the sample radius (R) electrical conductivity ($\sigma$), surface emissivity (h), thermal conductivity ($\kappa$) and magnetic permeability ($\mu$) such that $$4/\pi\sigma\mu R^2 < f < 16h^2/\pi\sigma\mu\kappa^2$$

This formulation and other useful parametric relationships for internal zone growth techniques are described by the publication U.S.E.R.D.A. Report C00-2407-4 entitled "Generalization of Internal Centrifugal Zone Growth of Metal-Ceramic Composities" by Robert A. Hartzell and Robert F. Sekerka, (1976) available from the National Technical Information Service, Springfield, Va., and which is herein incorporated by reference. Generally, for a compact 2 to 3.5 cm. in diameter, 2 to 5 MHz (megahertz) is employed. For a 3.5 to 6 cm. diameter compact, a 0.4 to 0.6 MHz frequency is suitable.

The compact can be prepared in any conventional manner to provide a metal and metal oxide article having about 85 to 95 percent theoretical density. For purposes of this invention, the theoretical density of the mixture is the weighted average theoretical density of the metal and metal oxide components used to prepare the compact. The density of the compact is critical. In compacts below about 85 percent theoretical density, a large void typically forms above the internal molten zone making controlled composite growth very difficult. In compacts above about 95 percent theoretical density, volume expansion upon melting typically ruptures the walls of the compact. The preferred method of forming the compact is hot pressing, however other methods such as cold pressing, sintering, etc. can be employed. Typically, the compact is formed into a cylindrical shape to facilitate controllable heating by a helical induction heating coil.

Induction heating can be performed in a conventional induction furnace. The cylindrical compact is positioned coaxially within the heating coil, oriented in a vertical direction. Means are provided for translating the compact through the coil. It is recommended that means be provided for rotating the compact around its axis during heating to minimize temperature variations due to asymmetrical variations in the electric field generated at the coil. Vertical orientation of the cylindrical compact is important to provide a relatively flat liquid/solid interface at the bottom of the molten zone, thereby resulting in parallel growth of metal rods within the solidified oxide crystal.

Since the method of this invention avoids the use of susceptors to elevate the temperature of the compact prior to inductive heating, the radiofrequency can be effectively coupled to the compact at room temperature. Heat-up is performed by gradually increasing the power to the induction coil. The temperature at the compact surface is monitored, e.g., by an optical pyrometer. The surface temperature which corresponds to a well-formed molten zone for a particular composition under particular operating conditions must be determined experimentally by a trial and error method. The surface temperature should be maintained at least 150°

C. below the eutectic temperature of the metal-metal oxide system. After the molten zone is formed, the compact is slowly, about 1 cm/hour, lowered (translated) through the heating coil. As the molten zone moves through the sample, the previously molten material solidifies into single metal oxide crystals with axially extending metal rods.

The process of this invention is suitably applied to the production of cermet composites in any metal-metal oxide system, including both binary and ternary systems, which contains at least one eutectic composition. Examples of such systems are $UO_2$—W, $UO_2$—Ta, $UO_2$—Mo, $UO_2(ThO_2)$—W, $ZrO_2(CaO)$—W, $ZrO_2(Y_2O_3)$—W, $ZrO_2$—$Al_2O_3$—Mo, $ZrO_2$—$CeO_2$—Mo, $HfO_2(CaO)$—W, $HfO_2(Y_2O_3)$—W, $Y_2O_3(CeO_2)$—W, $Y_2O_3(CeO_2)$—Mo, $Gd_2O_3$—Mo, $Gd_2O_3$—W, $Nd_2O_3$—Mo, $Nd_2O_3$—W, $La_2O_3$—Mo, $La_2O_3$—W, $Gd_2O_3(CeO_2)$—Mo, $Nd_2O_3(CeO_2)$—Mo, $Cr_2O_3$—Cr, $Cr_2O_3$—Mo, $Cr_2O_3$—W, $Cr_2O_3$—Re, $Cr_2O_3$—V, $Cr_2O_3$—Ta, $Cr_2O_3$—Nb, $La,CrO_3$—Mo, $Cr_2O_3$—Mo—Re, $(Cr,Al)_2O_3$—Cr, $(Cr,Al)_2O_3$—Mo, and $(Cr,Al)_2O_3$—W. The oxides in parentheses indicate components in solid solution.

Directionally solidified composites in the above systems are generally useful as high temperature, high strength, corrosion and erosion resistant cermets having enhanced unidirectional thermal and electrical conductivities. Of particular interest are cermet composites of $Cr_2O_3$ or $(Cr,Al)_2O_3$ and such metals as Mo, W, Cr, Re, Va, and Ta which have properties suitable for gas turbine environments.

It is recommended that the composites of this invention be prepared in an atmosphere which is chemically suited to the composite compositions and which has an oxygen pressure sufficient to suppress the decomposition of the oxide component yet insufficient to cause detrimental oxidation of the metal component at the temperature of the compact. The appropriate oxygen content of the furnace atmosphere can be easily calculated using published values for the standard free energy of formation of the relevant oxides. It is preferred that the oxygen partial pressure be maintained at a value which ensures stability of the desired composite materials at least 200° C. in excess of the eutectic temperature. The oxygen pressure also determines the concentration of the eutectic melt, hence the composition of the recrystallized cermet article can be regulated somewhat by control of oxygen pressure. The desired oxygen pressure can be achieved with an atmosphere of Ar and $O_2$, He and $O_2$, $N_2$ and $O_2$, $H_2O$ and $H_2$ or $CO_2$ and CO. Such mixtures can be easily tailored to provide the proper equilibrium $O_2$ pressure at the furnace temperature. Mixtures containing He or $N_2$ interact with high frequency RF fields and are suitable only at lower frequencies.

During fabrication of the composites, most systems experience the phenomenon of oxidation volatilization whereby quantities of the compact material (usually the oxide component) are volatilized from the compact and deposit onto the walls of the furnace. Such oxidation volatilization is not a serious problem since it does not affect the quality of the resultant composite, only the final metal/metal oxide ratio. Generally, the oxidation volatilization can be minimized when the oxygen pressure is maintained approximately midway between the calculated pressure at which the oxide decomposes and the calculated pressure at which the metal component oxidizes. As will be apparent to those skilled in the art, the appropriate oxygen content in the furnace atmosphere depends upon the sample temperature, the metal/metal oxide ratio of the composite and the total pressure. It is well within the skill of those familiar with high temperature ceramics and cermet fabrication to determine a chemically suited atmosphere by calculation or by routine experimentation. When composites comprising Mo and $Cr_2O_3$ are prepared, it is desirable to maintain an $O_2$ partial pressure of about $10^{-9}$ atmosphere which can be provided with CO and $CO_2$ atmosphere with a $CO/CO_2$ volume ratio of about 10 and a total pressure of one atmosphere.

Prior to this invention, attempts to prepare $Cr_2O_3$-Mo cermets by internal zone growth had been unsuccessful unless large Mo contents were used, greater than 17 volume percent. Even with such a large Mo percentage, a preheat of at least about 1600° C. was required to permit coupling of the radiofrequency field to the compact. For a discussion of attempts to prepare metal-metal oxide composites by prior methods, see "Directional Solidification by Internal Zone Melting of $Cr_2O_3$—Mo Composites" by J. D. Holder et al. appearing at Conference on In Situ Composites II, M. R. Jackson et al. Eds, Xerox Individualized Publishing, 1976, pp. 107–113 which is incorporated herein by reference.

The effectiveness of the present invention is illustrated by the following examples.

EXAMPLE I

About 150 grams of $Cr_2O_3$, sized $-50 +80$ mesh were dry tumbled with about 40 g of Mo, sized to $-100$ mesh. Blending was continued for about 8 hours after which the blended powders were placed in a Mo-lined graphite die having a 3 cm. inside diameter. The powders were hot pressed at 1550° C., 200 psig for 90 minutes to a density of about 90 percent theoretical density. The pellet, about 5 cm. long, was removed from the die and placed in a 4-turn RF coil having a diameter about 2 cm. larger than the diameter of the pellet. The bottom of the pellet was aligned about 1 cm. below the bottom turn of the coil. The furnace atmosphere was a mixture of CO and $CO_2$ with a $CO/CO_2$ ratio of 10/1 volume at a total pressure of 1 atmosphere. The RF coil was connected to a 10 Kw RF generator and the surface temperature of the compact was monitored by an optical pyrometer. The frequency was 2.2 MHz. The RF power was slowly increased over a period of five hours until the surface of the compact reached a temperature of 1710° C. (240° C. below the eutectic temperature), which experience has shown to indicate a well-formed internal molten zone. The pellet was lowered through the coil, about 1 cm/hr to produce a directionally solidified metal oxide-metal eutectic composite containing about 12 percent Mo as metal rods.

EXAMPLE II

To determine the appropriate particle size ratio (25 wt. percent, 10 volume percent Mo) for Mo and $Cr_2O_3$ particles, powder mixtures of $-325$ mesh Mo and three different particle sizes of $Cr_2O_3$ were blended for 8-12 hours and hot pressed at 1550° C., 200 psig for 90 minutes to +85 percent theoretical density in either a 2 or 3 cm. inner diameter die. The compacts were heated in the RF coil apparatus of Example 1 in the same atmospheric composition as Example I in an effort to produce directionally solidified eutectic composites. With $Cr_2O_3$ particles $-80 +150$ mesh, the RF coil would not couple to the compact and could produce no inductive heating. With $Cr_2O_3$ particles of $-30 +80$ mesh, surface melting occurred. A sound directionally solidified article was produced using $Cr_2O_3$ particles of $-50 +80$ mesh.

EXAMPLE III

About 40 g of $La_2CrO_3$, sintered to $-50 +85$ mesh, were dry blended with about 15 g Mo powder sized to $-100$ mesh. The mixed powders were placed in a Mo-lined graphite die of 2 cm. inner diameter and hot pressed to about 90 percent theoretical density. The resultant cylindrical pellet was heated in the atmospheric composition of Example I within a 4-turn RF coil in the manner of Example I at a frequency of 2.2 MHz. The surface temperature was allowed to rise to 1700° C. The resultant composite contained about 10 volume percent Mo as metal rods.

EXAMPLE IV

A ternary mixture of 33 wt. percent $ZrO_2$, 49 wt. percent $Al_2O_3$, 18 wt. percent Mo powder (oxide $-50 +80$ mesh, Mo, $-100$ mesh) was thoroughly dry blended and pressed to 85 percent theoretical density in a graphite die to provide a 3 cm diameter pellet. The pellet was heated in a RF coil at 2.2 MHz in the manner of Example I at a surface temperature of 1650° C. The resultant composite contained about 8 volume percent Mo. The $O_2$ pressure in this system can vary over a wide range. The furnace atmosphere was a mixture of $N_2$ and 10% by volume $H_2$ at a total pressure of 1 atmosphere. $H_2O$ was present due to unavoidable moisture present in $N_2$ from a standard cylinder.

EXAMPLE V

A ternary mixture of 73 wt percent $ZrO_2$, 10 wt. percent $CeO_2$ 17 wt. percent Mo powder (oxides $-50 +80$ mesh, Mo $-325$ mesh) was thoroughly dry blended and pressed to 85 percent theoretical density in a graphite die to provide a 3 cm diameter pellet. The pellet was heated in a RF coil at 3.8 MHz in the manner of Example I at a surface temperature of 1800° C. The resultant composite contained about 15 volume percent Mo. Mo powder of $-100$ mesh would also operate successfully in this example. The atmosphere had the same composition as in Example IV.

In another embodiment of this invention surface cooling can be provided to prevent the internal molten zone from melting through the compact surface. For example, the compact can be heated in a water-cooled crucible by the method known either as "skull melting" or "cold crucible melting." The technique involves RF heating of a compact while the external skin is simultaneously cooled by some method other than natural convection or radiation. The compact, ordinarily cylindrical, is held within a crucible having slotted sides or fingers for side members. The side members are water-cooled and engage the sides of the compact to facilitate heat removal during RF heating. The slotted configuration of the side members prevents them from being coupled to the RF field. Such "cold crucible" apparatus are commercially available and can be readily modified to permit translation of the coil or crucible if directionally solidified composites are to be prepared. The general technique of cold crucible melting is fully described in the publication "Skull Melting of Synthetic Minerals," LA-7080-MS, by S. D. Scott et al., published by the Los Alamos Scientific Laboratory, December 1977, available from the National Technical Information Service, Springfield, Va., and which is incorporated herein by reference.

Since the skull melting technique prevents melting of the sample skin, the metal and metal oxide particles need only be effectively sized (oxide particles generally larger than the metal particles) to permit direct inductive heating of the sample by the RF field from room temperature. Generally, the particles of oxide need to be $+80$ mesh and the metal particles $-100$ mesh for metal contents above about 8 volume percent. Compacts of $Cr_2O_3$-12 $\frac{1}{2}$ vol. % Mo-12 $\frac{1}{2}$ vol. % Re have been prepared from appropriately sized metal and oxide powders by skull melting without translation relative to the RF field. Melting and RF coupling occurred exactly as in compacts without external cooling.

It can be readily appreciated that the process of this invention can be applied to the preparation of a large number of metal-metal oxide composites by appropriate determination of the effective particle sizes for metal and oxide powders to permit room temperature coupling of a particular RF field for induction heating and when external cooling is not provided effective to prevent surface melting during internal zone growth steps. Since the particle size control of this invention provides compacts with a continuous metal phase and with appropriate electrical and thermal conductivity, other well known methods of providing cermet compacts having a continuous metal phase such as chemical vapor deposition and selective in-situ reduction of metal compounds as contemplated as equivalents to particle size control according to this invention. In-situ reduction of metal compounds to provide a continuous metal phase is described in U.S. Pat. No. 4,073,647 for "Preparation of Cermets," issued to C. S. Morgan, Feb. 14, 1978.

What is claimed is:
1. A method for preparing a cermet composite comprising the steps of
    (a) preparing a compact having about 85 to 95 percent theoretical density from a mixture of metal and metal oxide powders, said metal and metal oxide comprising a system containing a eutectic composition; and
    (b) inductively heating said compact in a radiofrequency field to cause the formation of an internal molten zone contained within an external solid skin of compact material, said metal oxide particles in said powder mixture being effectively sized relative to said metal particles to permit direct inductive heating of said compact by said radiofrequency from room temperature to form said internal molten zone.
2. The method of claim 1 in which said metal oxide particles are sized in U.S. Standard Sieve size larger than 80 mesh and said metal particles are sized smaller than 100 mesh.
3. The method of claim 1 wherein said metal oxide particles in said powder mixture are effectively sized relative to said metal particles to permit inductive heating of said compact to form said molten zone without melting said external solid skin.
4. The method of claim 3 in which said metal is present in said compact at 8–15 volume percent and said metal oxide particles are sized, in U.S. Standard Sieve size, smaller than 50 mesh and larger than 80 mesh, and said metal particles are smaller than 100 mesh.
5. The method of claim 1 or 3 in which said metal and metal oxide comprise a system selected from the group of $UO_2$—W, $UO_2$—Ta, $UO_2$—Mo, $UO_2(ThO_2)$—W,

$ZrO_2(CaO)$—W, $ZrO_2(Y_2O_3)$—W, $ZrO_2$—$Al_2O_3$—Mo, $ZrO_2$—$CeO_2$—Mo, $HfO_2(CaO)$—W, $HfO_2(Y_2O_3)$—W, $Y_2O_3(CeO_2)$—W, $Y_2O_3(CeO_2)$—Mo, $Gd_2O_3$—Mo, $Gd_2O_3$—W, $Nd_2O_3$—Mo, $Nd_2O_3$—W, $La_2O_3$—Mo, $La_2O_3$—W, $Gd_2O_3(CeO_2)$—Mo, $Nd_2O_3(CeO_2)$—Mo, $Cr_2O_3$—Cr, $Cr_2O_3$—Mo, $Cr_2O_3$—W, $Cr_2O_3$—Re, $Cr_2O_3$—V, $Cr_2O_3$—Ta, $Cr_2O_3$—Nb, $LaCrO_3$—Mo, $Cr_2O_3$—Mo—Re, $(Cr,Al)_2O_3$—Cr, $(Cr,Al)_2O_3$—Mo, and $(Cr,Al)_2O_3$—W.

6. The method of claim 1 or 3 in which said metal and metal oxide comprise a system selected from the group of $Cr_2O_3$—Cr, $Cr_2O_3$—Mo, $Cr_2O_3$—W, $Cr_2O_3$—Re, $Cr_2O_3$—V, $Cr_2O_3$—Ta, $Cr_2O_3$—Mo—Re $Cr_2O_3$—Nb, $(Cr,Al)_2O_3$—Cr, $(Cr,Al)_2O_3$—Mo, and $(Cr,Al)_2O_3$—W.

7. The method of claim 1 or 3 in which said metal is Mo and said metal oxide is selected from the group of $Cr_2O_3$, $LaCrO_3$, $ZrO_2$—$Al_2O_3$ and $ZrO_2$—$CeO_2$.

8. The method of claim 2 in which the external surface of said compact is cooled during said inductive heating step to prevent said solid skin from melting.

* * * * *